US012811585B2

(12) United States Patent
Saida

(10) Patent No.: US 12,811,585 B2
(45) Date of Patent: Nov. 24, 2026

(54) QUANTUM CIRCUIT, QUANTUM COMPUTING ELEMENT, QUANTUM COMPUTING SYSTEM, AND QUANTUM COMPUTING METHOD

(71) Applicant: NATIONAL INSTITUTE OF ADVANCED INDUSTRIAL SCIENCE AND TECHNOLOGY, Tokyo (JP)

(72) Inventor: Daisuke Saida, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 417 days.

(21) Appl. No.: 18/683,103

(22) PCT Filed: Jun. 20, 2022

(86) PCT No.: PCT/JP2022/024500
§ 371 (c)(1),
(2) Date: Feb. 12, 2024

(87) PCT Pub. No.: WO2023/017679
PCT Pub. Date: Feb. 16, 2023

(65) Prior Publication Data

US 2024/0348250 A1 Oct. 17, 2024

(30) Foreign Application Priority Data

Aug. 12, 2021 (JP) ................................ 2021-131568

(51) Int. Cl.
*H03K 17/92* (2006.01)
*G06N 10/00* (2022.01)
(Continued)

(52) U.S. Cl.
CPC ............ *H03K 17/92* (2013.01); *G06N 10/00* (2019.01); *G06N 10/20* (2022.01); *G06N 10/40* (2022.01)

(58) Field of Classification Search
CPC ........ H03K 17/92; G06N 10/20; G06N 10/40; G06N 10/00
(Continued)

(56) References Cited

U.S. PATENT DOCUMENTS 10,572,816 B1 * 2/2020 Vavilov ................. G06N 10/40
11,991,934 B1 * 5/2024 Jeffrey .................. B82Y 10/00
(Continued)

FOREIGN PATENT DOCUMENTS

EP 4270260 A2 * 11/2023 ............ H10W 20/43
JP 2021-512398 A 5/2021
(Continued)

OTHER PUBLICATIONS

International Search Report issued in PCT/JP2022/024500; mailed Sep. 13, 2022.
(Continued)

*Primary Examiner* — Arnold M Kinkead
(74) *Attorney, Agent, or Firm* — Studebaker Brackett PLLC

(57) ABSTRACT

Provided is a quantum circuit, a quantum computing element, a quantum computing system, and a quantum computing method with which physical reservoir computing with high learning efficiency becomes possible. A quantum circuit 100 includes a plurality of superconducting lines 101, 102, 103, 104 that form quantum bits in accordance with an electromagnetic state thereof, and that interact with each other, a plurality of lines L11, L12, L13, L14 that are electromagnetically coupled, respectively, to the plurality of superconducting lines 101, 102, 103, 104, a plurality of lines
(Continued)

L21, L22, L23, L24 that are electromagnetically coupled, respectively, to the plurality of superconducting lines 101, 102, 103, 104, and a plurality of readout circuits R1, R2, R3, R4 that are electromagnetically coupled, respectively, to the plurality of superconducting lines, wherein each first line is configured to be capable of receiving an input signal individually, and each readout circuit is configured to be capable of outputting a readout signal based on the state of the quantum bits of the corresponding superconducting line.

14 Claims, 9 Drawing Sheets

(51) Int. Cl.
*G06N 10/20* (2022.01)
*G06N 10/40* (2022.01)

(58) Field of Classification Search
USPC .......................................................... 326/3, 5
See application file for complete search history.

(56) References Cited

U.S. PATENT DOCUMENTS

2021/0085675 A1 3/2021 Zheng et al.
2024/0420005 A1* 12/2024 Luo ........................ G06N 10/40

FOREIGN PATENT DOCUMENTS

WO 2020/170392 A1 8/2020
WO 2021/064932 A1 4/2021

OTHER PUBLICATIONS

Yamane, Toshiyuki; "Machine Learning Device Using Physical Reservoir Computing and its Application to Edge Computing"; Pro Vision; vol. 95; 2019; pp. 57-61; partial English language translation.
International Preliminary Report On Patentability (Chapter I) and Written Opinion of the International Searching Authority issued in PCT/JP2022/024500; issued Feb. 13, 2024.

* cited by examiner

QUANTUM CIRCUIT, QUANTUM COMPUTING ELEMENT, QUANTUM COMPUTING SYSTEM, AND QUANTUM COMPUTING METHOD

TECHNICAL FIELD

The present invention relates to a quantum circuit, a quantum computing element, a quantum computing system, and a quantum computing method.

BACKGROUND ART

A method known as reservoir computing, which uses a neural network having an input layer, a reservoir layer, and an output layer, is available as a method of machine learning. The reservoir layer in reservoir computing is a recursive neural network having random connections. In other words, the reservoir layer is a network circuit that gives nonlinear responses.

A device for packaging the reservoir layer physically, using hardware, rather than by a software operation exists. In non-patent document 1, for example, this type of device is known as a physical reservoir device. Non-patent document 1 indicates that a reservoir layer can be constructed using physical phenomena in a physical reservoir device of a laser system or a spin system. Reservoir computing performed by constructing a reservoir layer using a physical reservoir device in this manner is known as physical reservoir computing.

In physical reservoir computing, a continuous signal is input into the input layer, and via the nonlinear response obtained in the reservoir layer, a continuous signal is output from the output layer. Learning in physical reservoir computing is performed by discretizing the input signal and the readout signal from the output layer, and updating the weight of the linear connection between the reservoir layer and the output layer so as to correct the values of the discretized signals.

CITATION LIST

Non-Patent Document

Non-Patent Document 1: YAMANE, Toshiyuki, “A machine learning device that uses physical reservoir computing and its application to edge computing”, ProVISION, IBM Japan, 2019, no. 95, pp. 57-61

SUMMARY

Technical Problem

In order to improve the learning efficiency in physical reservoir computing, the reservoir layer is preferably a dynamical system having high nonlinearity. In order to increase the nonlinearity, the degree of freedom of the dynamical system is preferably high. Although there have been various cases in which operations can be performed using a single element (1 bit) from which a physical reservoir can be constructed, it is difficult to realize a physical reservoir in which a plurality of elements cooperate in an orderly manner. In cases where it is difficult to make a plurality of elements cooperate, the degree of freedom of the dynamical system is limited, and as a result, it is difficult to improve the learning efficiency during physical reservoir computing.

Hence, an object of the present invention is to provide a quantum circuit, a quantum computing element, a quantum computing system, and a quantum computing method with which physical reservoir computing with high learning efficiency becomes possible.

Solution to Problem

A quantum circuit according to an aspect of the present invention includes a plurality of superconducting lines that form quantum bits in accordance with electromagnetic states thereof, and that interact with each other, a plurality of first lines that are electromagnetically coupled, respectively, to the plurality of superconducting lines, each first line being configured to be capable of receiving an input signal individually, a plurality of second lines that are electromagnetically coupled, respectively, to the plurality of superconducting lines, and a plurality of readout circuits that are electromagnetically coupled, respectively, to the plurality of superconducting lines, each readout circuit being configured to be capable of outputting a readout signal based on the state of the quantum bit of the corresponding superconducting line.

According to this aspect, an input signal is input individually into each first line. On the basis of the input signal, the first line controls the state of the quantum bit of the corresponding superconducting line. The states of the quantum bits of the superconducting lines change in accordance with the interactions between the superconducting lines. The readout signals from the readout circuits are signals based on states resulting from change in the states of the quantum bits of the superconducting lines based on the input signals. The readout signals are nonlinear signals rather than signals generated as a result of superimposing the input signals thereon. In the quantum circuit, an input signal is input into each first line individually, and therefore, by associating the input signals respectively with a plurality of parameters, the degree of freedom in the quantum circuit serving as a physical reservoir device can be increased. By increasing the degree of freedom in physical reservoir computing using the quantum circuit of the aspect described above, the degree of nonlinearity can be increased. As a result, the quantum circuit makes possible physical reservoir computing with high learning efficiency.

A quantum computing element according to another aspect of the present invention includes the quantum circuit of the aspect described above. Accordingly, the quantum computing element makes possible physical reservoir computing with high learning efficiency.

In the above aspect, the quantum computing element may further include a different quantum circuit to the quantum circuit of the aspect described above. Thus, the quantum computing element can switch between the quantum circuit of the aspect described above and a different quantum circuit in accordance with the computing application, and as a result becomes an element that is compatible with a plurality of computing applications.

A quantum computing system according to another aspect of the present invention includes the quantum computing element of the aspect described above, and a control device configured to supply the input signal to the quantum computing element and acquire the readout signal from the quantum computing element. Thus, physical reservoir computing can be controlled by the control device, thereby making possible physical reservoir computing with high learning efficiency.

The quantum computing system of the above aspect may further include a signal generation device that is connected to the control device to be capable of communicating therewith, and that generates a first signal, and the control device may be configured to supply the input signal, which is based on the first signal, to the quantum computing element. Thus, when the signal generation device supplies a signal that is based on a signal from a device such as a sensor, for example, to the quantum computing element, it is possible to realize physical reservoir computing in which learning and inferring are performed using signals from a device such as a sensor on the edge side of the system.

In the quantum computing system of the above aspect, the quantum computing element may be a first quantum computing element, the control device may be a first control device, and the quantum computing system may further include a second quantum computing element, a second control device configured to control computing in the second quantum computing element, and a computing management device that is connected to the first control device and the second control device to be capable of communicating therewith, and is configured to supply an element selection signal indicating the quantum computing element that is to perform quantum computing to the first control device or the second control device.

By having the computing management device supply the element selection signal so as to select the quantum computing element in accordance with the content of the computing processing, the quantum computing system becomes a system that can make use of computing results generated by a plurality of quantum computing elements.

A quantum computing method according to another aspect of the present invention includes supplying an input signal individually to each first line of a plurality of first lines that are electromagnetically coupled, respectively, to a plurality of superconducting lines that form quantum bits in accordance with electromagnetic states thereof, and outputting a readout signal from each readout circuit of a plurality of readout circuits that are electromagnetically coupled, respectively, to the plurality of superconducting lines, each readout signal being output on the basis of the state of the quantum bit of the corresponding superconducting line. Thus, similarly to the quantum circuit of the aspect described above, physical reservoir computing with high learning efficiency is made possible.

In the quantum computing method of the above aspect, outputting the readout signal may include outputting the readout signal as a continuous signal. By outputting the readout signal as a continuous signal, when the input signal is a continuous signal, the input signal and the readout signal are discretized, and learning is performed on the basis of the values of the discretized signals. As a result, physical reservoir computing becomes possible.

In the quantum computing method of the above aspect, supplying the input signal individually may include supplying the input signal to each of a number of first lines that is smaller than the number of readout circuits from which the readout signals are output. Thus, physical reservoir computing using a delayed network-type physical reservoir unit becomes possible.

In the quantum computing method of the above aspect, supplying the input signal individually may include supplying the input signal to each of a number of first lines that is larger than the number of readout circuits from which the readout signals are output. Thus, physical reservoir computing using a continuous medium-type physical reservoir unit becomes possible.

In the quantum computing method of the above aspect, supplying the input signal individually may include supplying the input signal to each first line at a different timing from the other first lines. Thus, it becomes possible to construct a physical reservoir unit having nonlinearity of both the delayed network type and the continuous medium type, and as a result, the learning efficiency is improved.

In the quantum computing method of the above aspect, supplying the input signal individually may include supplying the input signal to each first line with a different signal waveform to that of the other first lines. Thus, it becomes possible to construct a physical reservoir unit having nonlinearity of both the delayed network type and the continuous medium type, and as a result, the learning efficiency is improved.

In the quantum computing method of the above aspect, supplying the input signal individually may include supplying the input signal to at least one first line, and outputting the readout signal may include outputting the readout signal from the readout signal that is electromagnetically coupled to the superconducting line corresponding to the at least one first line to which the input signal was supplied.

By supplying the input signal to at least one first line and outputting the readout signal from the readout circuit that is electromagnetically coupled to the superconducting line to which the first line corresponds, computing by quantum annealing becomes possible. Therefore, with the quantum computing method described above, computing by quantum annealing can be performed in addition to physical reservoir computing.

The quantum computing method of the above aspect may further include supplying an adjustment signal individually to each of a plurality of second lines that are electromagnetically coupled, respectively, to the plurality of superconducting lines. Thus, the states of the quantum bits of the superconducting lines can be adjusted more finely, making it possible to more finely adjust the nonlinearity of the readout signals relative to the input signals.

Advantageous Effects of Invention

According to the present invention, it is possible to provide a quantum circuit, a quantum computing element, a quantum computing system, and a quantum computing method with which physical reservoir computing with high learning efficiency becomes possible.

DESCRIPTION OF EMBODIMENTS

Preferred embodiments of the present invention are described below with reference to the attached figures. Note that in the figures, components with identical reference symbols have identical or similar configurations.

First Embodiment

Figure 1:
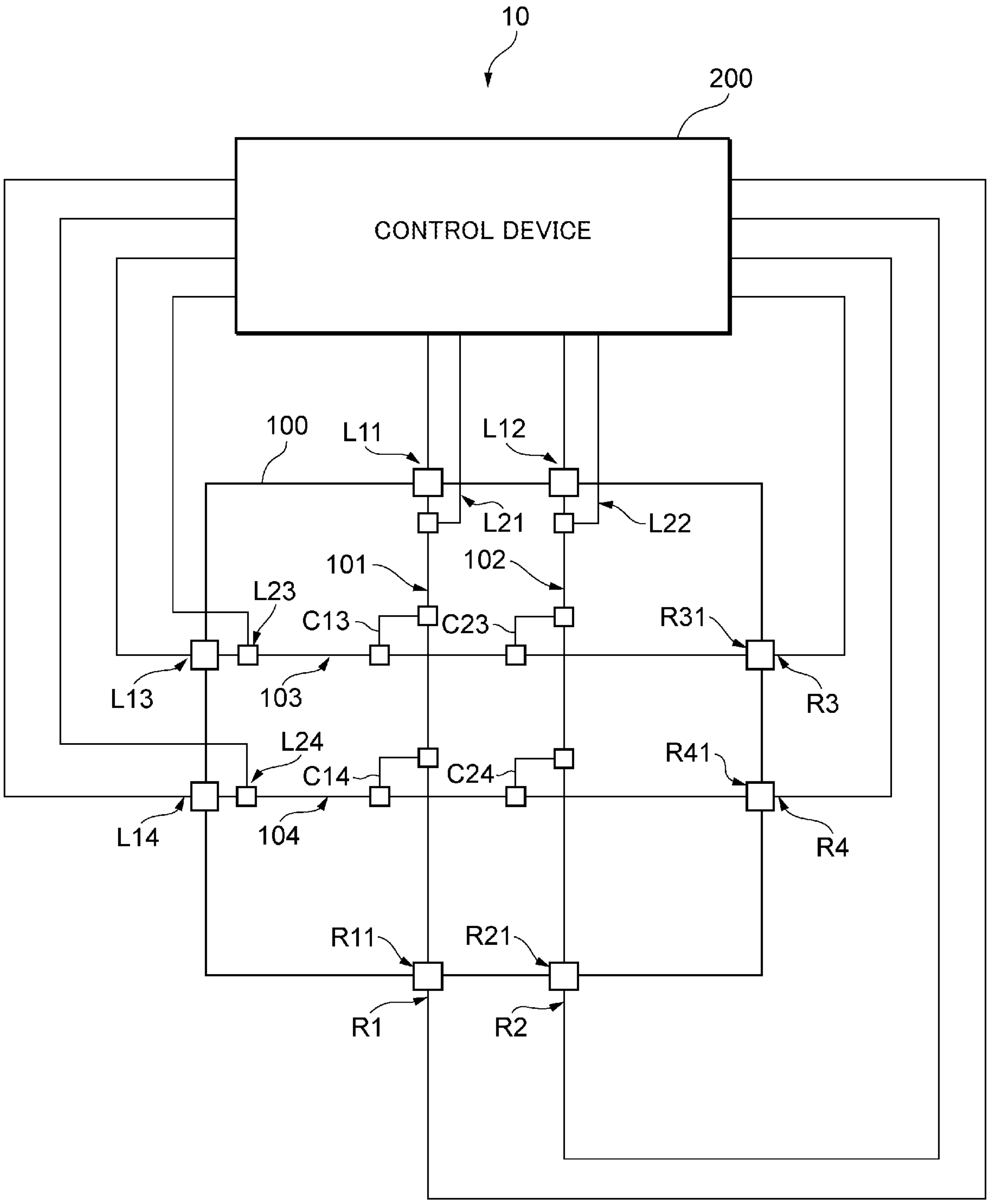
FIG. 1 is a view showing an outline of a quantum computing system according to a first embodiment.

A first embodiment will be described. FIG. 1 is a schematic view showing a quantum computing system 10 according to the first embodiment. The quantum computing system 10 includes a quantum circuit 100 and a control device 200. The quantum computing system 10 is a system in which the quantum circuit 100 is controlled by the control device 200 so as to perform quantum computing.

The quantum circuit 100 includes superconducting lines 101, 102, 103, 104, variable couplers C13, C23, C14, C24, and readout circuits R1, R2, R3, R4. The quantum circuit 100 is used after being cooled to or below the superconducting transition temperatures of the materials forming the superconducting lines 101, 102, 103, 104, the variable couplers C13, C23, C14, C24, and the readout circuits R1, R2, R3, R4. Accordingly, the quantum computing system 10 includes a mechanism (not shown) for cooling the quantum circuit 100.

Each of the superconducting lines 101, 102, 103, 104 forms a quantum bit in accordance with the electromagnetic state thereof. More specifically, the quantum state of the quantum bit is expressed by the circulation direction of the current flowing through the superconducting line. In FIG. 1, the superconducting line 101 and the superconducting line 102 are arranged in a latitudinal direction, while the superconducting line 103 and the superconducting line 104 are arranged in a longitudinal direction.

A line L11 (a first line) for applying a transverse magnetic field to the superconducting line 101 is provided so as to be electromagnetically coupled to the superconducting line 101. The line L11 receives input signals individually from the control device 200. The line L11 includes a line part that opposes a part of the superconducting line 101, and is electromagnetically coupled to the superconducting line 101 by this line part. In this embodiment, locations where parts of the superconducting lines are electromagnetically coupled to other members are indicated by squares on the superconducting lines 101, 102, 103, 104. Note that opposing means that a part of the superconducting line and a part of the line L11 overlap in plan view.

A line L21 (a second line) for applying a self magnetic field to the superconducting line 101 is provided so as to be electromagnetically coupled to the superconducting line 101. The line L21 includes a line part that opposes a part of the superconducting line 101, and is electromagnetically coupled to the superconducting line 101 by this line part.

The lines L11, L21 are connected to the control device 200. By applying a magnetic field that has been controlled by the control device 200 to the superconducting line 101 through the lines L11, L21, the energy state of the superconducting line 101 is controlled.

A readout circuit R1 for reading out the state of the quantum bit of the superconducting line 101 is provided on the superconducting line 101. The readout circuit R1 includes a Superconducting Quantum Interference Device (SQUID). In FIG. 1, a superconducting quantum interference device R11 is illustrated schematically. The readout circuit R1 is connected to the control device 200 through a line. In the readout circuit R1, magnetic flux is applied to the superconducting quantum interference device R11 on the basis of a signal from the control device 200. The readout circuit R1 outputs a readout signal based on the state of the quantum bit of the superconducting line 101 to the control device 200 in accordance with the interaction between the applied magnetic flux and the superconducting line 101.

The superconducting line 102, similarly to the superconducting line 101, is provided with lines L12, L22 and the readout circuit R2. The superconducting line 103, similarly to the superconducting line 101, is provided with lines L13, L23 and the readout circuit R3. The superconducting line 104, similarly to the superconducting line 101, is provided with lines L14, L24 and the readout circuit R4.

The variable coupler C13 includes a ring portion that opposes the superconducting line 101 and the superconducting line 103 without contact, and causes the superconducting line 101 and the superconducting line 103 to interact by electromagnetic induction. The strength of the interaction can be adjusted as appropriate.

The variable coupler C23, similarly to the variable coupler C13, causes the superconducting line 102 and the superconducting line 103 to interact by electromagnetic induction. The variable coupler C14, similarly to the variable coupler C13, causes the superconducting line 101 and the superconducting line 104 to interact by electromagnetic induction. The variable coupler C24, similarly to the variable coupler C13, causes the superconducting line 102 and the superconducting line 104 to interact by electromagnetic induction. Note that the variable couplers may be provided so as to cause any sets of the superconducting lines 101, 102, 103, 104 to interact. Moreover, there does not need to be four variable couplers, as shown in FIG. 1, and the number thereof can be adjusted as appropriate.

In the quantum circuit 100, the number of superconducting lines is set at four, but the number thereof is not limited to four, and a configuration in which a larger number of lines is used may be employed. In this case, the numbers of first lines, second lines, and readout circuits also increase.

The control device 200 is a computer for causing the quantum circuit 100 to execute quantum computing. The control device 200 includes a ROM, a RAM, a CPU, and so on. By executing a program stored in the control device 200 using the CPU, the control device 200 executes processing for controlling the quantum computing performed in the quantum circuit 100.

Figure 2:
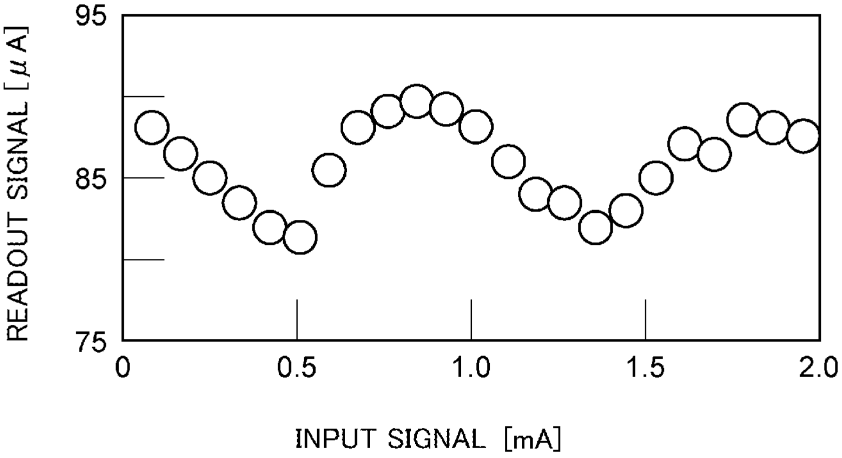
FIG. 2 is a view illustrating a relationship between an input signal and a readout signal in a quantum computing element according to the first embodiment.
Figure 3:
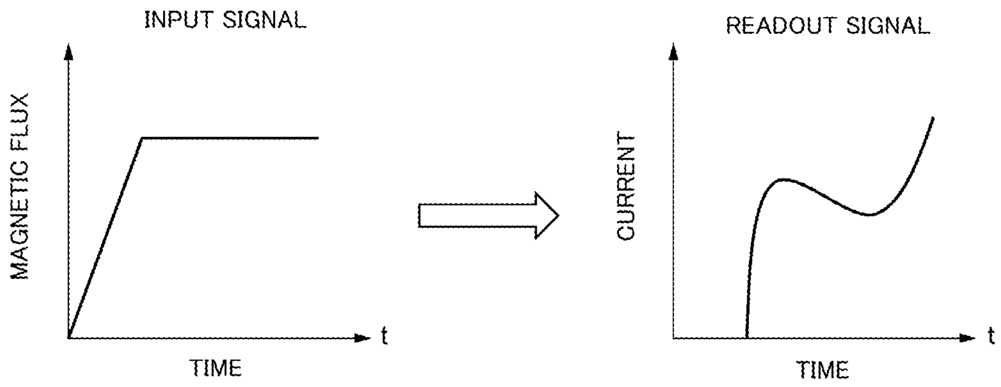
FIG. 3 is a view illustrating the concepts of the input signal and the readout signal in the quantum computing element according to the first embodiment.

Referring to FIGS. 2 and 3, the relationship between the input signal and the readout signal in the quantum computing system 10 will be described.

FIG. 2 is a graph showing an example of a readout signal output from a certain readout circuit in the quantum circuit 100 when an input signal is input into a certain superconducting line. The horizontal axis shows the magnitude of the input signal, and the input signal is expressed as a current value. The input signal in the form of a current is converted into magnetic flux through a line and input into the superconducting line. The state of the quantum bit of each of the superconducting lines 101, 102, 103, 104 in the quantum circuit 100 varies in accordance with the interactions between the superconducting lines. The readout signal on the vertical axis is acquired as a current value corresponding to the state of the quantum bit of the corresponding superconducting line.

As shown in FIG. 2, the readout signal does not always increase in response to an increase in the input signal. In other words, in the quantum circuit 100, the readout signal varies nonlinearly rather than linearly in relation to the input signal.

FIG. 3 is a view illustrating the concepts of signal input and readout. As shown in FIG. 3, magnetic flux serving as the input signal is supplied to the superconducting line through the first line over a certain period of time. Here, as noted above, the magnetic flux is controlled by a current value. The magnetic flux serving as the input signal is supplied to the superconducting line continuously, leading to variation in the state of the quantum bit of the superconducting line. At this time, the readout signal output by the readout circuit is output as a continuous signal that varies nonlinearly over time in accordance with the interactions between the superconducting lines in the quantum circuit 100. Note that in FIG. 3, the input signal is exemplified as a signal in which the magnetic flux intensity is saturated, but the input signal may also be a nonlinear curve. Likewise in this case, the readout signal is output as a continuous signal that varies nonlinearly over time in accordance with the interactions between the superconducting lines in the quantum circuit 100.

Thus, in the quantum circuit 100, a nonlinear readout signal corresponding to the input signal is output. Accordingly, the quantum circuit 100 is capable of functioning as a physical reservoir in physical reservoir computing.

Figure 4:
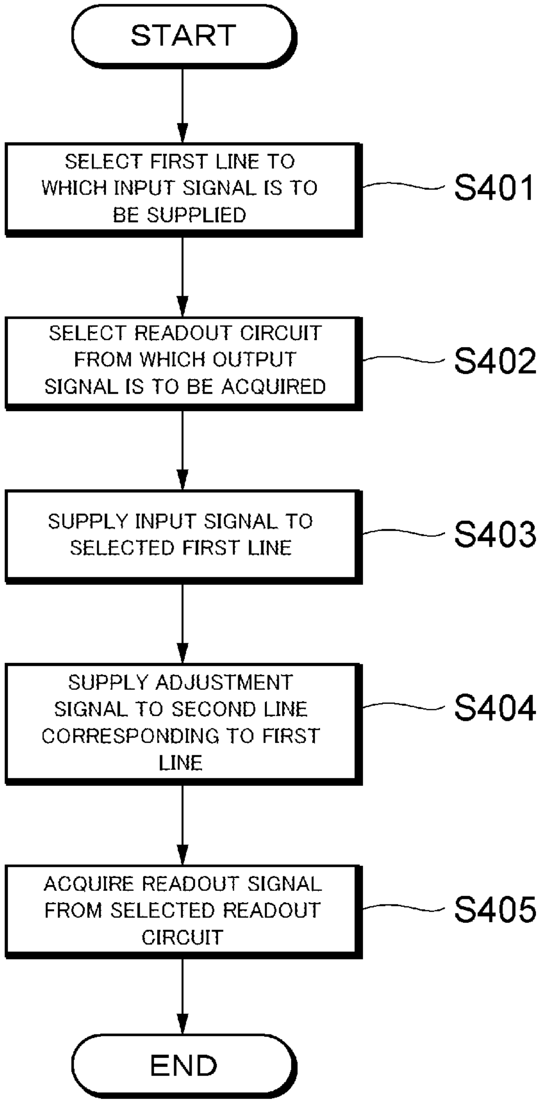
FIG. 4 is a flowchart of processing performed in a control device according to the first embodiment.

FIG. 4 is a flowchart showing an example of processing performed by the control device 200 to control the computing performed in the quantum circuit 100.

In step S401, the control device 200 selects the first line on which the input signal is to be supplied. At this time, for example, the control device 200 acquires information specifying a computing mode set in the quantum circuit 100 from an external device, and selects the first line on the basis of this information.

In step S402, the control device 200 selects the readout circuit from which the readout signal is to be acquired. Similarly to step S401, the control device 200 acquires information specifying the computing mode set in the quantum circuit 100 from an external device, and selects the readout circuit on the basis of this information.

In step S403, the control device 200 supplies an input signal to the selected first line. More specifically, the control device 200 supplies to the selected first line a current for controlling the magnetic flux applied to the superconducting line that corresponds to the first line.

In step S404, the control device 200 supplies an adjustment signal to the second line corresponding to the first line. More specifically, the control device 200 supplies to the second line a current for controlling the magnetic flux supplied to the superconducting line through the second line that corresponds to the selected first line. Note that the processing of step S404 may be omitted, and instead, the control device 200 may supply a current only to the first line.

In step S405, the control device 200 acquires a readout signal from the selected readout circuit. More specifically, the control device 200 applies magnetic flux to the superconducting quantum interference device corresponding to the selected readout circuit, and acquires a readout signal in the form of a current signal from the superconducting quantum interference device.

A case in which, in the above steps, a first line is selected and an adjustment signal is supplied to the second line after supplying the input signal to the first line was described above as an example. However, the control device 200 may select a second line instead of the first line selected in step S401. In this case, the control device 200 may supply the adjustment signal to the second line instead of the first line in step S403. Finally, the control device 200 may supply the input signal to the first line to which the second line corresponds instead of the second line in step S404. Note that the control device 200 may supply a current only to the second line. Likewise in a case where a second line is selected, readout can be performed in a similar manner in step S405.

Figure 5:
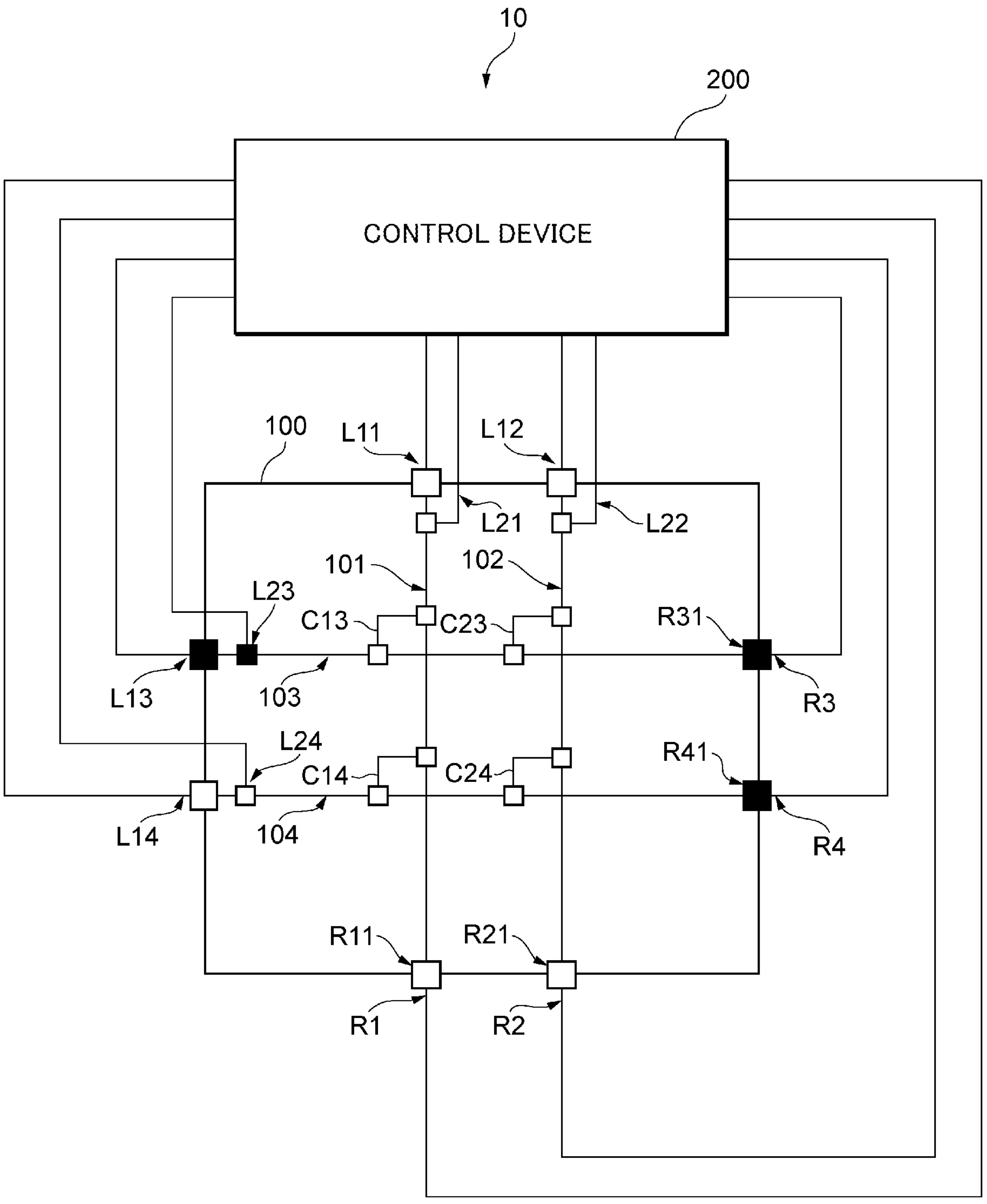
FIG. 5 is a view illustrating an example operation of the quantum computing system according to the first embodiment.
Figure 6:
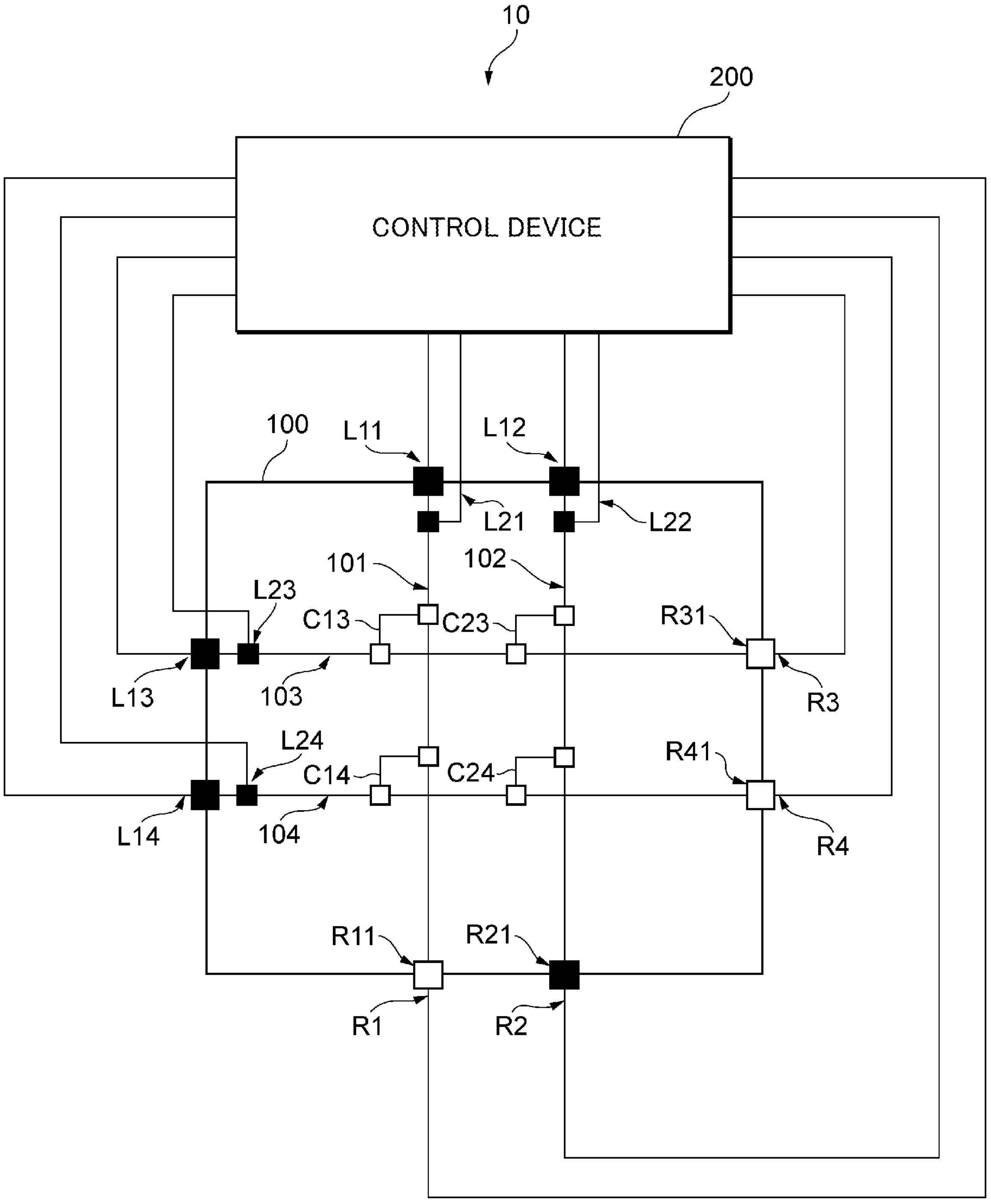
FIG. 6 is a view illustrating another example operation of the quantum computing system according to the first embodiment.
Figure 7:
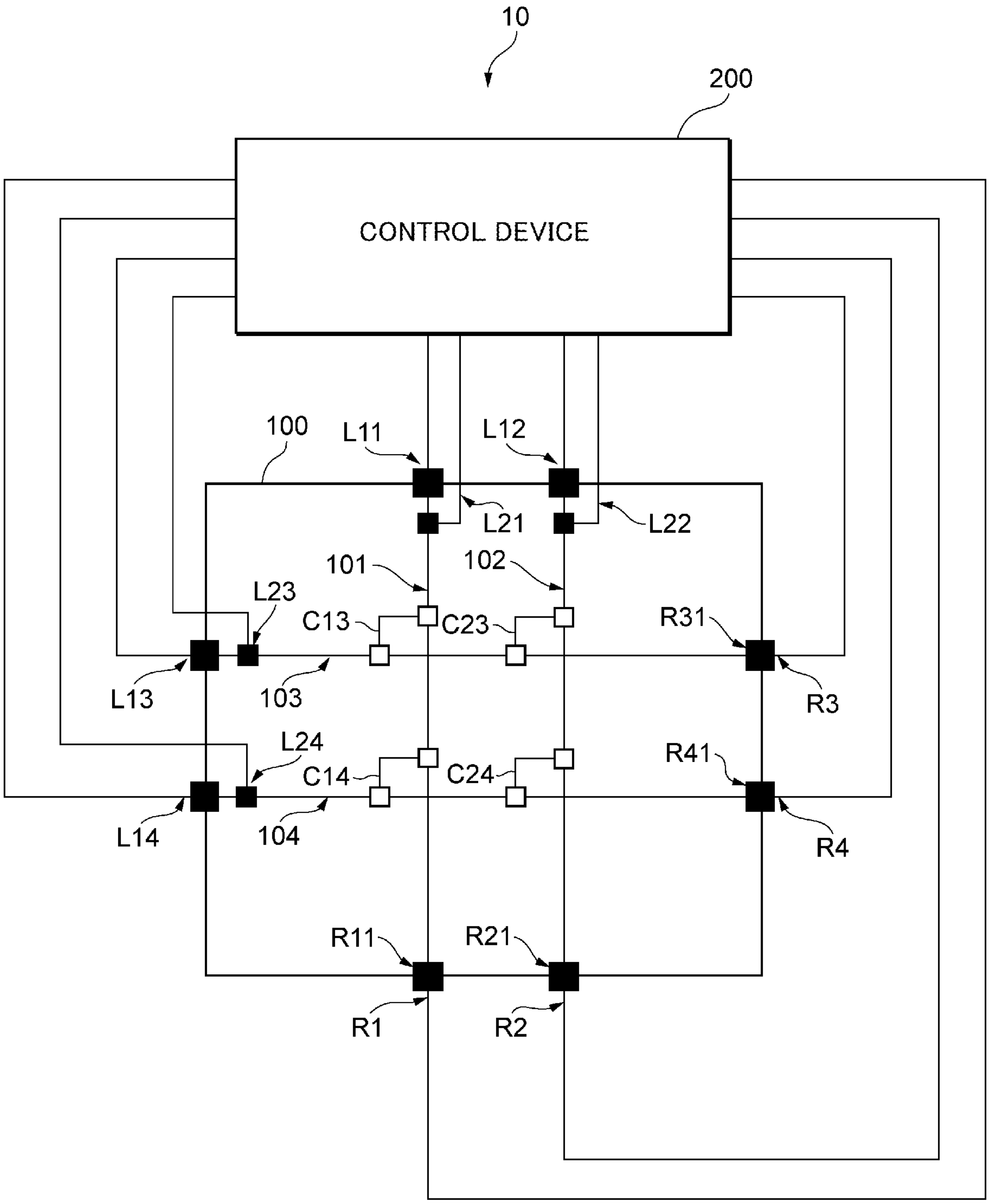
FIG. 7 is a view illustrating another example operation of the quantum computing system according to the first embodiment.

Referring to FIGS. 5 to 7, specific examples relating to selection of the first line and selection of the readout circuit in the quantum computing system 10 will be described. FIG. 5 is a schematic view of a first specific example. FIG. 5 shows a condition in which the line L13 corresponding to the superconducting line 103 has been selected as the supply destination of the input signal, and the readout circuits R3 and R4 corresponding respectively to the superconducting line 103 and the superconducting line 104 have been selected as the acquisition sources of readout signals.

At this time, the readout signal from the readout circuit R3 and the readout signal from the readout circuit R4 are formed as different signals by the interactions between the superconducting lines 101, 102, 103, 104.

Thus, in the quantum computing system 10, input signals can be supplied to a smaller number of first lines than the number of readout circuits from which readout signals are output. Accordingly, the quantum circuit 100 functions as a delayed network-type physical reservoir unit that is capable of outputting a plurality of nonlinear readout signals to the input signal.

FIG. 6 is a schematic view of a second specific example. FIG. 6 shows a condition in which the lines L11, L12, L13, L14 corresponding to the superconducting lines 101, 102, 103, 104 have been selected as the supply destinations of input signals, and the readout circuit R2 corresponding to the superconducting line 102 has been selected as the acquisition source of the readout signal.

At this time, the readout signal from the readout circuit R2 is a signal corresponding to the interactions between the superconducting lines 101, 102, 103, 104. Thus, in the quantum computing system 10, input signals can be supplied to a larger number of first lines than the number of readout circuits from which readout signals are output. Accordingly, the quantum circuit 100 functions as a continuous medium-type physical reservoir unit that is capable of outputting one or more nonlinear readout signals.

Further, for example, the control device 200 can supply signals having the same signal waveform to the lines L11, L12, L13, L14 at different timings. At this time, the readout signal from the readout circuit R2 includes nonlinearity based on the time-delayed input signals in addition to the nonlinearity produced by the interactions between the superconducting lines 101, 102, 103, 104, and is therefore a readout signal with higher nonlinearity. Thus, the nonlinearity of the readout signal can be increased.

Furthermore, for example, the control device 200 can supply to the respective lines L11, L12, L13, L14 input signals having different signal waveforms to those of the other lines. At this time, the readout signal from the readout circuit R2 includes nonlinearity resulting from differences in the magnitudes of the input signals in addition to the nonlinearity produced by the interactions between the superconducting lines 101, 102, 103, 104, and is therefore a readout signal with higher nonlinearity. Thus, the nonlinearity of the readout signal can be further increased.

FIG. 7 is a schematic view of a third specific example. FIG. 7 shows a condition in which the lines L11, L12, L13, L14 corresponding to the superconducting lines 101, 102, 103, 104 have been selected as the supply destinations of input signals, and the readout circuits R1, R2, R3, R4 corresponding to the superconducting lines 101, 102, 103, 104 have been selected as the acquisition sources of readout signals.

At this time, in the quantum circuit 100, the respective states of the quantum bits of the superconducting lines 101, 102, 103, 104 are set individually. The states of the individual quantum bits are set on the basis of the input signals supplied to the lines L11, L12, L13, L14 and the adjustment signals supplied to the lines L21, L22, L23, L24. Further, the readout signals resulting from the interactions are output from the readout circuits corresponding respectively to the superconducting lines 101, 102, 103, 104. Thus, the quantum circuit 100 is capable of executing computing by quantum annealing. Accordingly, the quantum circuit 100 may be both a physical reservoir device that makes physical reservoir computing possible and a quantum annealing device that makes computing by quantum annealing possible.

Note that although the quantum circuit 100 is illustrated in the figures as a circuit including the two superconducting lines 101, 102 arranged in the latitudinal direction and the two superconducting lines 103, 104 arranged in the longitudinal direction, the number and arrangement of the superconducting lines are not limited to those shown in the figures. For example, in the quantum circuit, four superconducting lines may be arranged in the latitudinal direction and four superconducting lines may also be arranged in the longitudinal direction. In this case, of the eight superconducting lines, the states of the quantum bits of some of the superconducting lines may be set, and the states of these quantum bits following annealing may be read out. The used superconducting lines are selected in accordance with the Hamiltonian expressing the problem to be solved by the quantum circuit. When the quantum circuit according to this embodiment is used for quantum annealing, some or all of the superconducting lines provided in the quantum circuit may be used.

Furthermore, the quantum circuit may include a plurality of unit matrices, each of which includes two superconducting lines arranged in the latitudinal direction and two superconducting lines arranged in the longitudinal direction, and the unit matrices may be provided so as to be electromagnetically connected to each other. Alternatively, the unit matrix may include four superconducting lines arranged in the latitudinal direction and four superconducting lines arranged in the longitudinal direction. When a quantum circuit is configured by connecting a plurality of unit matrices, depending on the Hamiltonian, the first and second lines and the readout circuits included in some of the unit matrices may not be used.

Second Embodiment

Figure 8:
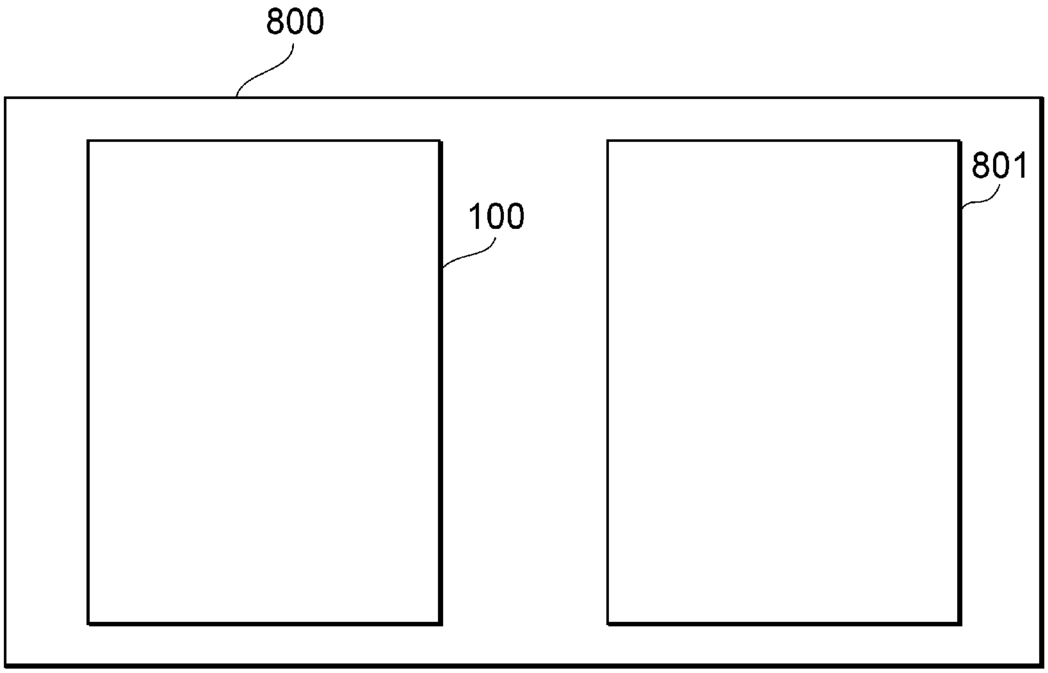
FIG. 8 is a view showing an outline of a quantum computing element according to a second embodiment.

A second embodiment will now be described. FIG. 8 is a schematic view of a quantum computing element 800 according to the second embodiment. The quantum computing element 800 is provided with the quantum circuit 100 and a quantum circuit 801. The quantum circuit 801 may be a quantum circuit in which the number of superconducting lines and the manner in which the variable couplers are coupled differ from the quantum circuit 100. By providing the single quantum computing element 800 with a plurality of quantum circuits in this manner, a plurality of quantum computing operations can be performed by a single chip.

Third Embodiment

Figure 9:
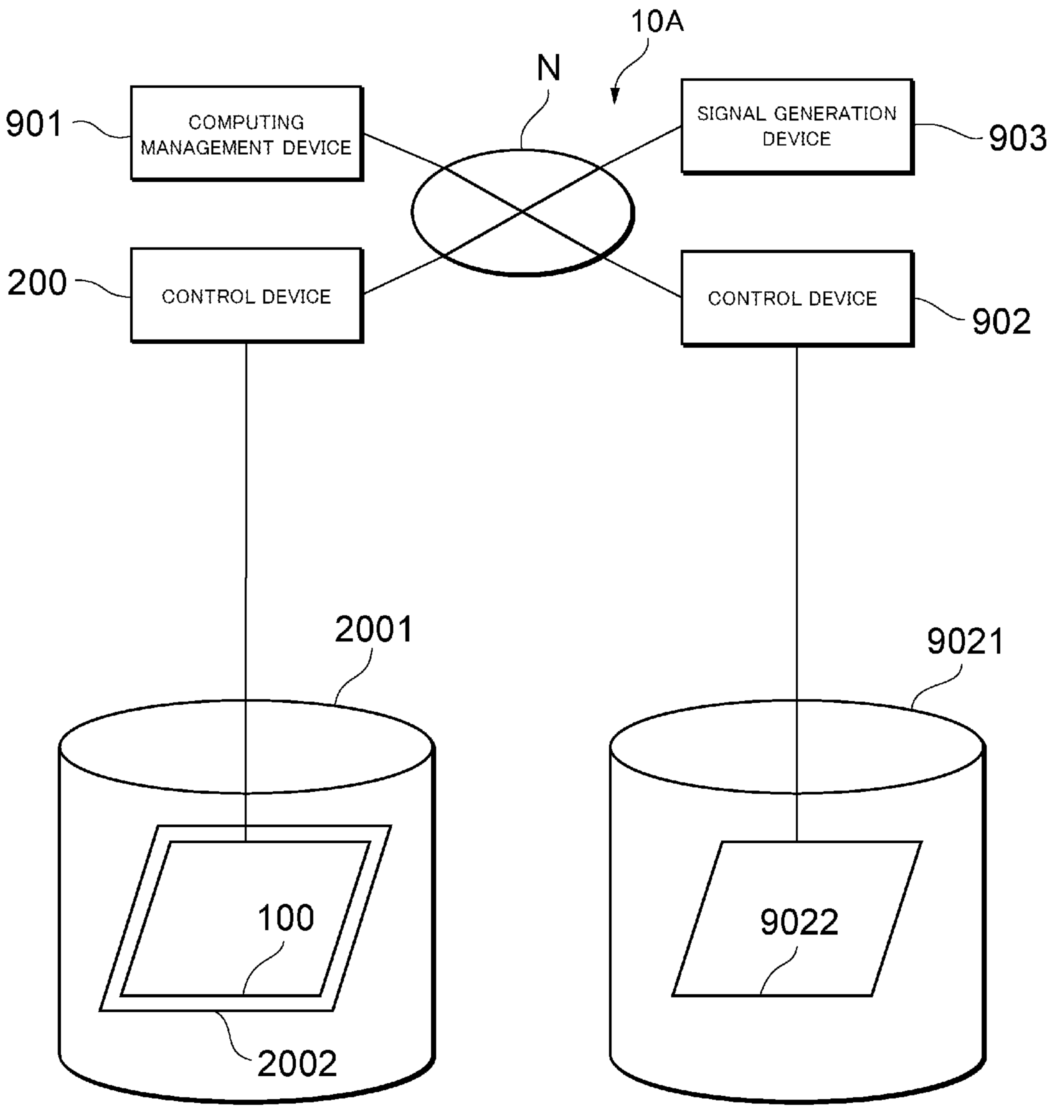
FIG. 9 is a view showing an outline of a quantum computing system according to a third embodiment.

A third embodiment will now be described. FIG. 9 is a schematic view of a quantum computing system 10A according to the third embodiment. The quantum computing system 10A includes control devices 200, 902, a computing management device 901, a signal generation device 903, dilution refrigerators 2001, 9021, and quantum computing elements 2002, 9022. Here, the quantum circuit 100 is formed in the quantum computing element 2002, which is disposed in the dilution refrigerator 2001.

The control devices 200, 902, the computing management device 901, and the signal generation device 903 are connected so as to be capable of communicating with each other through a network N.

The computing management device 901 is a computer that manages the computing performed in the quantum computing system 10A by executing processing for selecting the quantum computing element that is to perform quantum computing.

The control device 902 is a computer that controls quantum computing using the quantum computing element 9022, which is disposed in the dilution refrigerator 9021. The quantum computing element 9022 performs a different type of quantum computing from the quantum computing element 2002. For example, the quantum computing element 2002 includes the quantum circuit 100 and therefore performs quantum computing using an annealing method, whereas the quantum computing element 9022 is capable of performing quantum computing using a gate method or a quantum dot method. In the quantum computing system 10A, the dilution refrigerator 9021 is used, but a different type of refrigerator to a dilution refrigerator may be used.

The signal generation device 903 is a computer that generates a signal based on a signal from an external sensor (not shown), for example. The signal generated by the signal generation device 903 is transmitted to the computing management device 901.

The computing management device 901 selects the appropriate quantum computing element for processing the signal from the signal generation device 903 on the basis of the signal. In accordance with the selection result, the computing management device 901 transmits an element selection signal indicating the quantum computing element that is to perform the quantum computing to the control device 200 or the control device 902.

Having received the element selection signal, the control device 200 or the control device 902 controls quantum computing by the corresponding quantum computing element 2002 or 9022.

In the quantum computing system 10A, the signal generation device 903 can transmit a signal to the computing management device 901 on the basis of a signal from a device such as a sensor located on the edge side. As a result, physical reservoir computing can be performed while making use of calculation results generated by a plurality of quantum computing elements. Moreover, physical reservoir computing using a signal from a device such as a sensor located on the edge side becomes possible.

Note that a case in which the control device 902 controls quantum computing by the quantum computing element 9022 in the quantum computing system 10A was described above as an example, but the control subject of the control device 902 is not limited to the quantum computing element 9022. For example, the control device 902 may be used to control a quantum computer that uses light, a pseudo-quantum computer realized using an FPGA (Field Programmable Gate Array) or a CMOS circuit, a computer that executes conventional, classical computing, a supercomputer, or the like.

The embodiments described above are for facilitating understanding of the present invention, and are not to be interpreted as limiting the present invention. The elements included in the embodiments, as well as the arrangements, materials, conditions, shapes, sizes, and so on thereof, are not limited to the examples described above and may be changed as appropriate. Moreover, configurations described in different embodiments may be partially replaced or combined.

REFERENCE SIGNS LIST

10, 10A Quantum computing system
100, 801 Quantum circuit
101, 102, 103, 104 Superconducting line
200 Control device
800 Quantum computing element
901 Computing management device
902 Control device
903 Signal generation device
L11, L12, L13, L14 Line
R1, R2, R3, R4 Readout circuit

What is claimed is:

1. A quantum circuit comprising:
- a plurality of superconducting lines that form quantum bits in accordance with an electromagnetic state thereof, and that interact with each other;
- a plurality of first lines that are electromagnetically coupled, respectively, to the plurality of superconducting lines, each of the first lines being configured to be capable of receiving an input signal individually at a different timing from the other first lines; and
- a plurality of readout circuits that are electromagnetically coupled, respectively, to the plurality of superconducting lines, each of the readout circuits being configured to be capable of outputting a readout signal based on the state of the quantum bits of the corresponding superconducting line.

2. A quantum computing element comprising the quantum circuit according to claim 1.

3. The quantum computing element according to claim 2, further comprising a different quantum circuit to the quantum circuit.

4. A quantum computing system comprising:
- the quantum computing element according to claim 2; and
- a control device configured to supply the input signal to the quantum computing element and acquire the readout signal from the quantum computing element.

5. The quantum computing system according to claim 4, further comprising a signal generation device that is connected to the control device to be capable of communicating therewith, and that generates a first signal,
- wherein the control device is configured to supply the input signal, which is based on the first signal, to the quantum computing element.

6. The quantum computing system according to claim 4, wherein the quantum computing element is a first quantum computing element, and the control device is a first control device,
- the quantum computing system further comprising:
  - a second quantum computing element;
  - a second control device configured to control computing in the second quantum computing element; and
  - a computing management device that is connected to the first control device and the second control device to be capable of communicating therewith, and is configured to supply an element selection signal indicating the quantum computing element that is to perform quantum computing to the first control device or the second control device.

7. A quantum computing method comprising the steps of:
- supplying an input signal individually to each first line of a plurality of first lines that are electromagnetically coupled, respectively, to a plurality of superconducting lines that form quantum bits in accordance with electromagnetic states thereof; and
- outputting a readout signal from each readout circuit of a plurality of readout circuits that are electromagnetically coupled, respectively, to the plurality of superconducting lines, each of the readout signal being output on the basis of the state of the quantum bits of the corresponding superconducting line,
- wherein supplying the input signal individually includes supplying the input signal to each first line at a different timing from the other first lines.

8. The quantum computing method according to claim 7, wherein outputting the readout signal includes outputting the readout signal as a continuous signal.

9. The quantum computing method according to claim 7, wherein supplying the input signal individually includes supplying the input signal to each of a number of first lines that is smaller than the number of readout circuits from which the readout signals are output.

10. The quantum computing method according to claim 7, wherein supplying the input signal individually includes supplying the input signal to each of a number of first lines that is larger than the number of readout circuits from which the readout signals are output.

11. A quantum computing method comprising the steps of:
- supplying an input signal individually to each first line of a plurality of first lines that are electromagnetically coupled, respectively, to a plurality of superconducting lines that form quantum bits in accordance with electromagnetic states thereof; and
- outputting a readout signal from each readout circuit of a plurality of readout circuits that are electromagnetically coupled, respectively, to the plurality of superconducting lines, each of the readout signal being output on the basis of the state of the quantum bits of the corresponding superconducting line,
- wherein supplying the input signal individually includes supplying the input signal to each first line with a different signal waveform to that of the other first lines.

12. The quantum computing method according to claim 7, wherein supplying the input signal individually includes supplying the input signal to at least one first line, and
- outputting the readout signal includes outputting the readout signal from the readout circuit that is electromagnetically coupled to the superconducting line corresponding to the at least one first line to which the input signal was supplied.

13. The quantum computing method according to claim 7, further comprising supplying an adjustment signal individually to each of a plurality of second lines that are electromagnetically coupled, respectively, to the plurality of superconducting lines.

14. A quantum circuit comprising:

a plurality of superconducting lines that form quantum bits in accordance with an electromagnetic state thereof, and that interact with each other;

a plurality of first lines that are electromagnetically coupled, respectively, to the plurality of superconducting lines, each of the first line being configured to be capable of receiving an input signal individually with a different signal waveform to that of the other first lines; and a plurality of readout circuits that are electromagnetically coupled, respectively, to the plurality of superconducting lines, each of the readout circuit being configured to be capable of outputting a readout signal based on the state of the quantum bits of the corresponding superconducting line.

* * * * *